(12) United States Patent
Jia et al.

(10) Patent No.: US 6,383,989 B2
(45) Date of Patent: May 7, 2002

(54) ARCHITECTURE FOR HIGH CRITICAL CURRENT SUPERCONDUCTING TAPES

(75) Inventors: Quanxi Jia; Stephen R. Foltyn, both of Los Alamos, NM (US)

(73) Assignee: The Regents of the University of California, Los Alamos, NM (US)

( * ) Notice: Subject to any disclaimer, the term of this patent is extended or adjusted under 35 U.S.C. 154(b) by 0 days.

(21) Appl. No.: 09/867,842

(22) Filed: May 29, 2001

Related U.S. Application Data

(60) Provisional application No. 60/213,111, filed on Jun. 21, 2000.

(51) Int. Cl.[7] ............... H01B 12/02; H01L 39/02; B32B 13/06
(52) U.S. Cl. ............... 505/236; 505/235; 505/237; 505/238
(58) Field of Search ............... 505/236, 237, 505/238, 235; 428/600, 615

(56) References Cited

U.S. PATENT DOCUMENTS

| | | | | |
|---|---|---|---|---|
| 5,087,605 A | * | 2/1992 | Hegde et al. ............... 505/1 |
| 5,430,014 A | * | 7/1995 | Soltner et al. ............... 505/238 |
| 5,906,965 A | * | 5/1999 | Rao ............... 505/470 |
| 5,994,276 A | * | 11/1999 | Hughes et al. ............... 505/238 |
| 6,191,073 B1 | * | 2/2001 | Hojczyk et al. ............... 505/238 |

* cited by examiner

*Primary Examiner*—Mark Kopec
(74) *Attorney, Agent, or Firm*—Bruce H. Cottrell

(57) ABSTRACT

Improvements in critical current capacity for superconducting film structures are disclosed and include the use of, e.g., multilayer YBCO structures where individual YBCO layers are separated by a layer of an insulating material such as $CeO_2$ and the like, a layer of a conducting material such as strontium ruthenium oxide and the like or by a second superconducting material such as SmBCO and the like.

7 Claims, 10 Drawing Sheets

ARCHITECTURE FOR HIGH CRITICAL CURRENT SUPERCONDUCTING TAPES

The present invention claims the benefit of provisional patent application Ser. No. 60/213,111, filed on Jun. 21, 2000.

STATEMENT REGARDING FEDERAL RIGHTS

This invention was made with government support under Contract No. W-7405-ENG-36 awarded by the U.S. Department of Energy. The government has certain rights in the invention.

FIELD OF THE INVENTION

The present invention relates to composite structures for achieving high critical current densities in superconductive film tapes. Such composite structures can be a multilayer structure or architecture for high critical current superconductive tapes.

BACKGROUND OF THE INVENTION

Since their initial development, coated conductor research has focused on fabricating increasing lengths of the material, while increasing the overall critical current carrying capacity. Different research groups have developed several techniques of fabricating coated conductors. Regardless of which techniques are used for the coated conductors, the goal of obtaining highly textured superconducting thick films, such as $YBa_2Cu_3O_{7-x}$ (YBCO), with high supercurrent carrying capability on metal substrates remains. The use of thick superconducting films for coated conductors appears logical because both the total critical current and the engineering critical current density (defined as the ratio of total critical current and the cross-sectional area of the tape) are directly correlated with the thickness of the superconducting films.

It has been known for some time that the critical current density of a YBCO film is a function of film thickness for films on either single crystal wafers or polycrystalline nickel-based alloy substrates. A higher critical current density is achieved at a YBCO film thickness in the range of about 100 to about 400 nanometers (nm). On the other hand, critical current density tends to decrease with increasing YBCO film thickness. For example, Foltyn et al., Appl. Phys. Lett., 63, 1848–1850, 1993, demonstrated that critical current density saturates to a value of around 1 megaampere per square centimeter ($MA/cm^2$) for YBCO films having a thickness beyond 2 micrometers ($\mu m$) on single crystal substrates. Critical current density is lower for YBCO on polycrystalline metal substrates, mainly due to less superior in-plane texture of the YBCO films. The challenge is that adding more YBCO material beyond about 2 $\mu m$ using normal processing conditions on metal substrates does not contribute to the overall supercurrent carrying capability. This suggests that the supercurrent in such thick YBCO films on metal substrates is not uniformly distributed throughout the film thickness. It is now believed that a high defect density present in the top region of a thick YBCO film results in such a problem.

Despite the recent progress in production of superconductive tapes, continued improvements remain desirable in the magnitude of critical current properties.

It is an object of the present invention to provide superconducting tapes having high critical current values.

It is another object of the present invention to provide superconducting tapes having high critical current values by use of a multilayer architecture of alternating layers of, e.g., YBCO and an insulating material such as $CeO_2$ and the like or a conducting material such as strontium ruthenium oxide and the like.

It is still another object of the present invention to provide superconducting tapes having high critical current values by use of a multilayer architecture of alternating layers of, e.g., YBCO and a second superconducting material such as SmBCO and the like.

SUMMARY OF THE INVENTION

To achieve the foregoing and other objects, and in accordance with the purposes of the present invention, as embodied and broadly described herein, the present invention provides a superconducting structure including a substrate, a film of a superconducting rare-earth-barium-copper oxide upon the substrate, the film comprising a composite multilayer structure of a first layer of a superconducting rare-earth-barium-copper oxide from about 0.2 microns to about 2 microns in thickness, a layer of an insulating material selected from the group consisting of cerium oxide, strontium titanate, yttrium oxide, magnesium oxide, and yttria-stabilized zirconia, or of a conducting material such as lanthanum strontium cobalt oxide and strontium ruthenium oxide, and a second layer of a superconducting rare-earth-barium-copper oxide from about 0.2 microns to about 2 microns in thickness, the superconducting structure characterized as having a total combined thickness of superconducting rare-earth-barium-copper oxide layers of at least 2 microns and characterized as having a critical current for the composite multilayer structure greater than a critical current for a single superconducting rare-earth-barium-copper oxide layer of about the same thickness, the single superconducting rare-earth-barium-copper oxide layer including the same rare-earth as the composite multilayer structure.

The present invention farther provides a superconducting structure including a substrate, and, a film of a superconducting rare-earth-barium-copper oxide upon the substrate, the film comprising a composite multilayer structure of a first layer of a superconducting rare-earth-barium-copper oxide where the rare earth is selected from the group consisting of yttrium, neodymium, samarium, europium, gadolinium, erbium and ytterbium, the first layer from about 0.2 microns to about 2 microns in thickness, an interlayer of a second superconducting rare-earth-barium-copper oxide where the rare earth is a different rare earth than the first layer and is selected from the group consisting of yttrium, neodymium, samarium, europium, gadolinium, erbium and ytterbium, the interlayer from about 0.02 microns to about 2 microns in thickness, and a second layer of a superconducting rare-earth-barium-copper oxide where the rare earth is a different rare earth than the interlayer selected from the group consisting of yttrium, neodymium, samarium, europium, gadolinium, erbium and ytterbium, the second layer from about 0.2 microns to about 2 microns in thickness, the superconducting structure characterized as having a total combined thickness of superconducting rare-earth-barium-copper oxide layers of at least 2 microns and characterized as having a critical current for the composite multilayer structure greater than a critical current for a single superconducting rare-earth-barium-copper oxide layer including a single rare earth metal, the layer of about the same thickness, the single superconducting rare-earth-barium-copper oxide layer including a same rare-earth as contained by the composite multilayer structure.

DETAILED DESCRIPTION

The present invention is concerned with high temperature superconducting wire or tape and the use of high temperature superconducting films to form such wire or tape. In the present invention, the superconducting material is generally YBCO, e.g., $YBa_2Cu_3O_{7-\delta}$, $Y_2Ba_4Cu_7O_{14+x}$, or $YBa_2Cu_4O_8$, although other minor variations of this basic superconducting material may also be used. Other superconducting materials such as bismuth and thallium based superconductor materials may also be employed. $YBa_2Cu_3O_{7-\delta}$ is preferred as the superconducting material.

In the high temperature superconducting film of the present invention, the substrate can be, e.g., any polycrystalline material such as a metal or a ceramic such as polycrystalline aluminum oxide or polycrystalline zirconium oxide. Preferably, the substrate can be a polycrystalline metal such as nickel, copper and the like. Alloys including nickel such as various Hastalloy metals are also useful as the substrate as are alloys including copper. The metal substrate on which the superconducting material is eventually deposited should preferably allow for the resultant article to be flexible whereby superconducting articles (e.g., coils, motors or magnets) can be shaped. Other substrates such as rolling assisted biaxially textured substrates (RABiTS) may be used as well.

The measure of current carrying capacity is called "critical current" and is abbreviated as Ic, measured in Amperes and "critical current density" is abbreviated as $J_c$, measured in Amperes per square centimeter.

The present invention is concerned with enhancing the total current carrying capability of a YBCO film for coated conductors. In one embodiment, the present invention uses multilayer architecture to remove the limitations of a single layer film used in coated conductors where the critical current does not increase linearly with increasing the film thickness.

Figure 1:
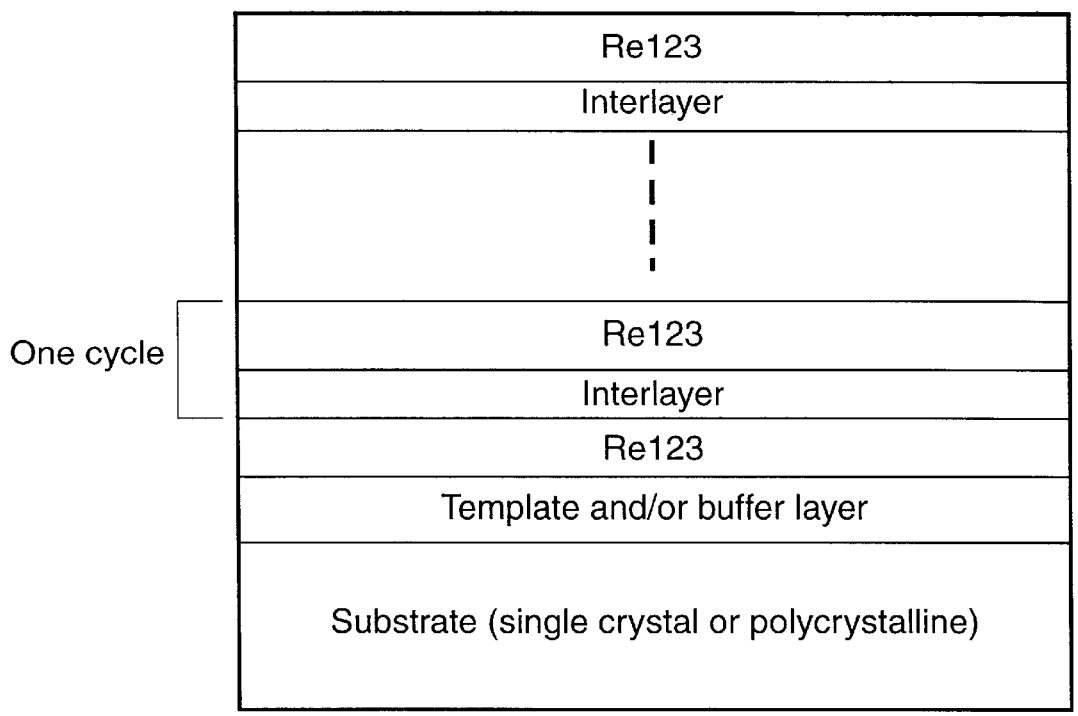
FIG. 1 shows a generic structure of a composite multilayer YBCO film in accordance with an embodiment of the present invention.
Figure 2:
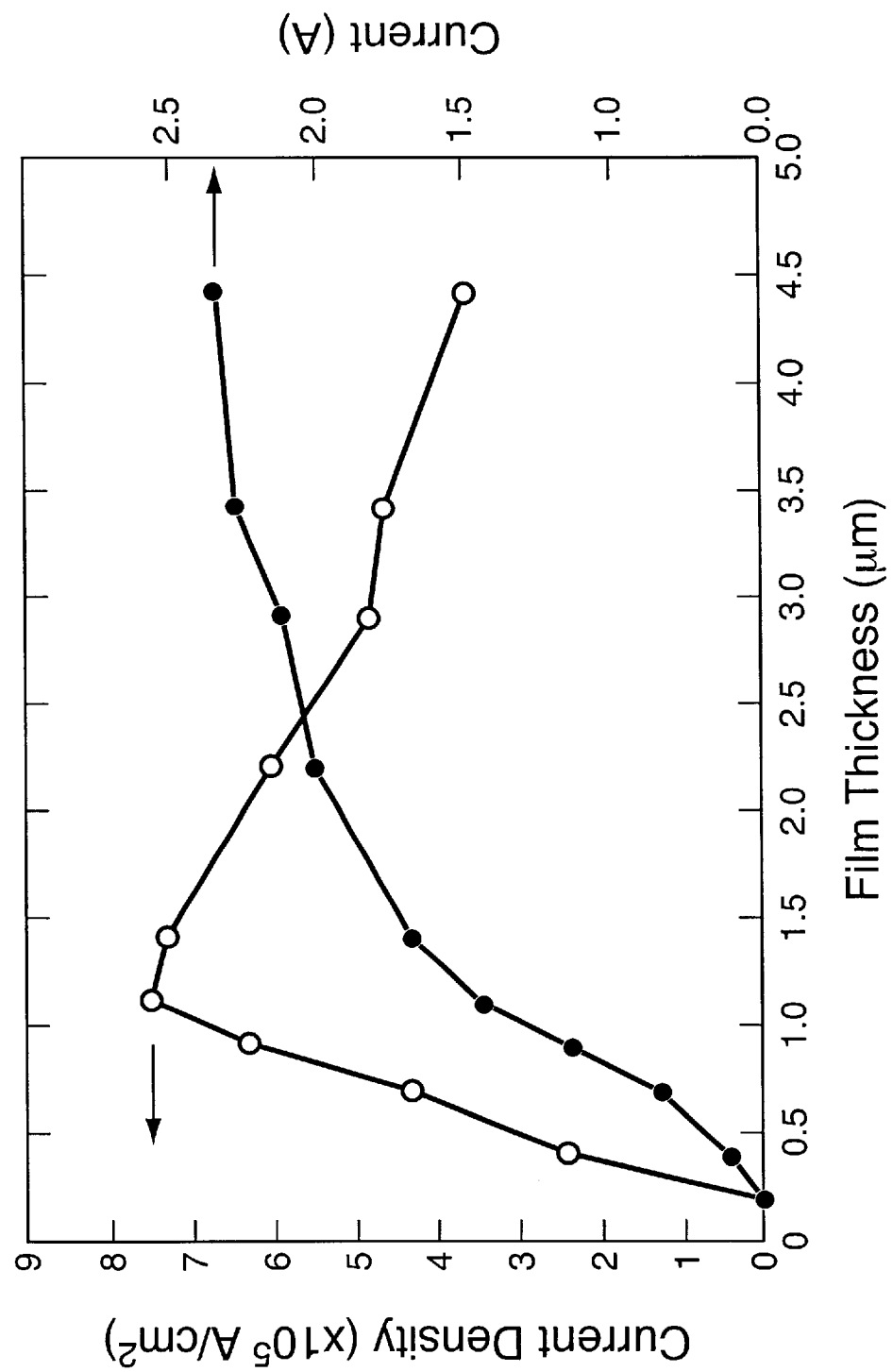
FIG. 2 shows a plot of the current carrying capacity (critical current and current density) of a single layer YBCO film as a function of film thickness.

This invention provides an architecture as shown in FIG. 1 to enhance the total current carrying capability for a YBCO film. An interlayer, which can be an insulating material, a conducting material, or a superconducting material is used to terminate the growth of defects and to provide a new template for growth of a subsequent superconducting layer, e.g., a YBCO layer. This process can be repeated as many times as desired or necessary. This multilayer approach provides more surface area where surface pinning may play additional role in enhancing the critical current of the superconducting films. The interlayer materials should be chemically and structurally compatible with YBCO and can be generally chosen from, e.g., strontium ruthenium oxide ($SrRuO_3$), cerium oxide ($CeO_2$), strontium titanate ($SrTiO_3$), magnesium oxide (MgO), yttrium oxide ($Y_2O_3$), yttri-stabilized zirconia (YSZ), lanthanum aluminum oxide ($LaAlO_3$), lanthanum strontium cobalt oxide ($La_{0.5}Sr_{0.5}CoO_3$) and neodymium gadolinium oxide ($NdGaO_3$). Preferably, the interlayer material is $SrRuO_3$, $CeO_2$, or $SrTiO_3$ and more preferably, the interlayer material is $CeO_2$. For insulating and conducting materials, the interlayer thickness is generally in the range of about 20 nanometers (nm) to about 200 nm. For superconducting materials as the interlayer, the interlayer thickness is generally in the range of about 20 nm to about 2 microns ($\mu$m). The individual layers of YBCO can have a general thickness in the range of about 0.2 $\mu$m to about 2 $\mu$m, more preferably in the range of from about 0.6 $\mu$m to about 2 $\mu$m. The total thickness of the multilayer film is greater than about 1 $\mu$m up to about 10 $\mu$m, and generally from about 2 $\mu$m to about 5 $\mu$m. Different layers of the multilayer may have different thicknesses for selected applications.

Various combinations of rare-earth-barium-copper oxides may be used in the different layers. The rare earth metals can generally be any suitable rare earth metal from the periodic table, but is preferably chosen from among yttrium, neodymium, samarium, europium, gadolinium, erbium and ytterbium. In a three layer example, combinations for the first and third layers (with the interlayer of the insulating, conducting or superconducting material) would include, for example, both layers of a single rare earth, or one rare earth in the first layer and a different rare earth in the third layer. Additionally, either or both the first or third layer may include a mixture of rare earth metals within the single layer. For multilayer composites with more than three layers, the possible combinations would multiply but can readily be worked out by one skilled in the art. Yttrium is a preferred rare earth to form the well-known YBCO.

It has been found that there is less structural imperfection of the YBCO film by using such a design. A multilayer stack consisting of $YBCO/CeO_2/YBCO/CeO_2/YBCO$ was deposited on a $LaAlO_3$ substrate with a total YBCO thickness of about 1.2 $\mu$m. Compared to a single layer YBCO film with the same total film thickness deposited under the same conditions, the $\chi_{min}$ of the multilayer film is less than about 20% (shown in FIG. 3) in comparison to a value of about 55% (shown in FIG. 4).

The preservation of high crystallinity and structural perfection of the YBCO film achieved by using such a design was also observed in examination of cross-sectional transmission electron microscopy micrographs (TEM). A cross-sectional TEM micrograph of a multilayer YBCO/CeO$_2$/YBCO/CeO$_2$/YBCO on LaAlO$_3$ showed the interfaces were sharp and smooth. Importantly, the microstructure of the very top layer retained its high quality even for a 1.2 μm thick film. The top layer YBCO exhibited almost perfect crystal structure that is very similar to the crystal structure of a thin YBCO film on single crystal substrate. This approach can be advantageous for developing superconducting films with a higher or maximum critical current density, whereas the critical current density peaks at a thinner film thickness for single layer YBCO films. A major advantage of this approach is that the growth induced defects in a YBCO film can be terminated at the interface instead of propagating into the top region of a single YBCO film.

Figure 5:
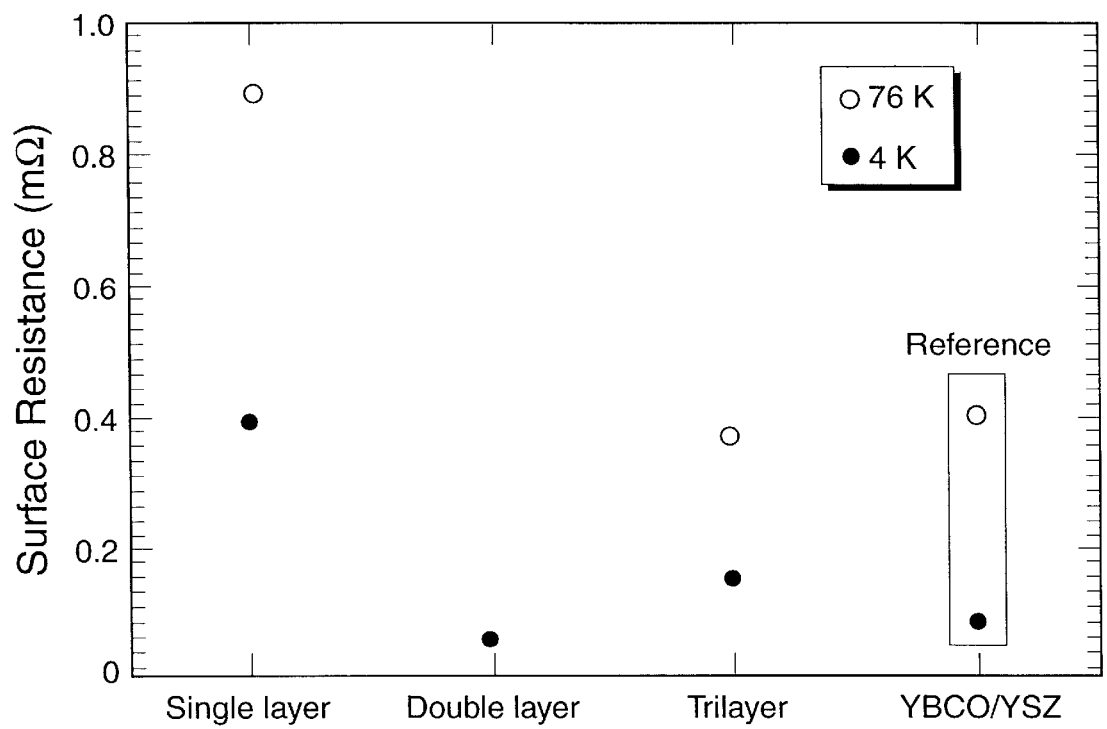
FIG. 5 shows surface resistance (at 10 GHz) of YBCO films (with thickness from about 1.0 to about 1.2 $\mu$m) on $LaAlO_3$ substrates with different structures where the surface resistance of a single layer of YBCO (about 400 nm) on a single crystal YSZ is included for comparison.

Good quality of the top YBCO layer can be obtained by using the present design. The surface resistance of a YBCO film is related to many factors such as surface roughness, Josephson weak-links, and other defects present in the film. By using a multilayer [YBCO/CeO$_2$]$^n$ (n=1,2,3 . . . ) structure, it has been shown that the surface resistance of a thick YBCO film (about 1.0 μm to about 1.2 μm) on a LaAlO$_3$ substrate is comparable to a thinner YBCO film (about 400 nm) on a single crystal YSZ substrate. Shown in FIG. 5 is the surface resistance of YBCO films with different multilayer structures compared to the single layer YBCO film with the same thickness deposited under the same conditions. This suggests that the top YBCO layer of the multilayer is functioning more like a thinner single layer YBCO film on a single crystal substrate.

Multilayer YBCO films on crystal substrate can be achieved by using such a structure. It has been shown that both an insulating interlayer and a conductive interlayer can be used for such a multilayer scheme. For example, it has been demonstrated that the average critical current density for a structure of YBCO/SrRuO$_3$/YBCO/SrRuO$_3$/YBCO/SrRuO$_3$/YBCO with a total YBCO thickness of 1.12 μm is 2.7×10$^6$ A/cm$^2$ at 75.2 K. The electrical contact was done by etching a ramp.

Another experiment was designed where a relatively thicker (1200 mn) CeO$_2$ interlayer was inserted in between the top and bottom YBCO layers. In this case, the current carrying capability from the top and bottom layers was measured separately because the insulating layer was thick enough to isolate the top and bottom layers. It was demonstrated that the top layer (0.7 μm) and the bottom layer (about 1 μm) of YBCO can each carry a critical current density of 2.1×10$^6$ A/cm$^2$ at 75.2 K, respectively where this multilayer was deposited on a single crystal YSZ substrate. This indicates that the deposition of an interlayer and the YBCO top layer does not degrade the bottom YBCO layer. Importantly, both layers show similar superconducting properties.

Multilayer YBCO films have been deposited on polycrystalline Ni-alloy using YSZ deposited by ion beam assisted deposition (IBAD-YSZ) as a template. IBAD-MgO can also be used as a template. A multilayer YBCO/CeO$_2$/YBCO structure was deposited on an EBAD-YSZ/Ni-alloy substrate, where the thickness of the CeO$_2$ layer was in the range of from about 200 to about 250 nm. The top layer of YBCO (1.25 μm) had a critical current density of over 2×10$^6$ A/cm$^2$ for a 2 mm long bridge and over 10$^6$ A/cm$^2$ for a 6.5 mm long bridge at 75.2 K.

The YBCO layer can be deposited, e.g., by pulsed laser deposition or by methods such as evaporation including coevaporation, e-beam evaporation and activated reactive evaporation, sputtering including magnetron sputtering, ion beam sputtering and ion assisted sputtering, cathodic arc deposition, chemical vapor deposition, organometallic chemical vapor deposition, plasma enhanced chemical vapor deposition, molecular beam epitaxy, a sol-gel process, a solution process and liquid phase epitaxy. Post-deposition anneal processes are necessary with some deposition techniques to obtain the desired superconductivity.

In pulsed laser deposition, powder of the material to be deposited can be initially pressed into a disk or pellet under high pressure, generally above about 1000 pounds per square inch (PSI) and the pressed disk then sintered in an oxygen atmosphere or an oxygen-containing atmosphere at temperatures of about 950° C. for at least about 1 hour, preferably from about 12 to about 24 hours. An apparatus suitable for pulsed laser deposition is shown in Appl. Phys. Lett. 56, 578 (1990), "Effects of Beam Parameters on Excimer Laser Deposition of YBa$_2$Cu$_3$O$_{7-\delta}$", such description hereby incorporated by reference.

Suitable conditions for pulsed laser deposition include, e.g., the laser, such as an excimer laser (20 nanoseconds (ns), 248 or 308 nanometers (nm)), targeted upon a rotating pellet of the target material at an incident angle of about 45°. The substrate can be mounted upon a heated holder rotated at about 0.5 rpm to minimize thickness variations in the resultant film or coating, The substrate can be heated during deposition at temperatures from about 600° C. to about 950° C., preferably from about 700° C. to about 850° C. An oxygen atmosphere of from about 0.1 millitorr (mTorr) to about 10 Torr, preferably from about 100 to about 250 mTorr, can be maintained within the deposition chamber during the deposition. Distance between the substrate and the pellet can be from about 4 centimeters (cm) to about 10 cm.

The deposition rate of the film can be varied from about 0.1 angstrom per second (A/s) to about 200 A/s by changing the laser repetition rate from about 0.1 hertz (Hz) to about 200 Hz. Generally, the laser beam can have dimensions of about 1 millimeter (mm) by 4 mm with an average energy density of from about 1 to 4 joules per square centimeter (J/cm$^2$). After deposition, the films generally are cooled within an oxygen atmosphere of greater than about 100 Torr to room temperature.

The present invention is more particularly described in the following examples which are intended as illustrative only, since numerous modifications and variations will be apparent to those skilled in the art.

EXAMPLE 1

Figure 3:
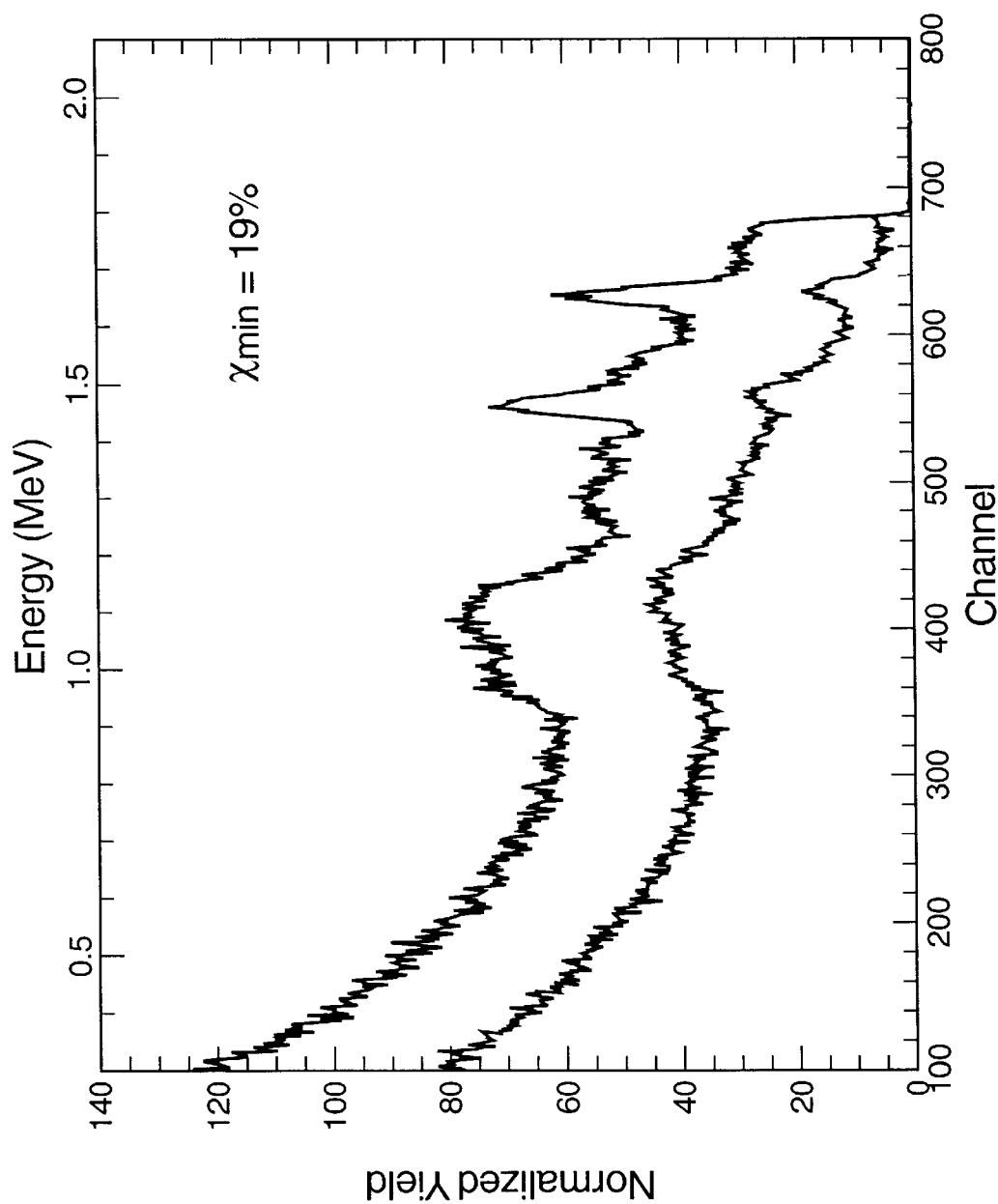
FIG. 3 shows the Rutherford Backscattering Spectroscopy (RBS) spectra for a multilayer $YBCO/CeO_2/YBCO/CeO_2/YBCO$ on a $LaAlO_2$ substrate where the dashed and solid lines represent the channeling and random spectra respectively and the total thickness of the YBCO layers is 1.2 $\mu$m.

A multilayer of YBCO/CeO$_2$/YBCO/CeO$_2$/YBCO was deposited on a single crystal LaAlO$_3$ substrate using pulsed laser deposition under conventional processing conditions (see, Jia et al., Physica C, v. 228, pp. 160–164, 1994). Each YBCO layer was 0.4 μm in thickness for a total YBCO thickness of 1.2 μm. Each CeO$_2$ layer was about 50 nm. As seen in FIG. 3, Rutherford backscattering spectroscopy on this multilayer stack yielded a $\chi_{min}$, which is a direct indication of degree of structural defect or disorder in the film, of less than about 20 percent.

Figure 4:
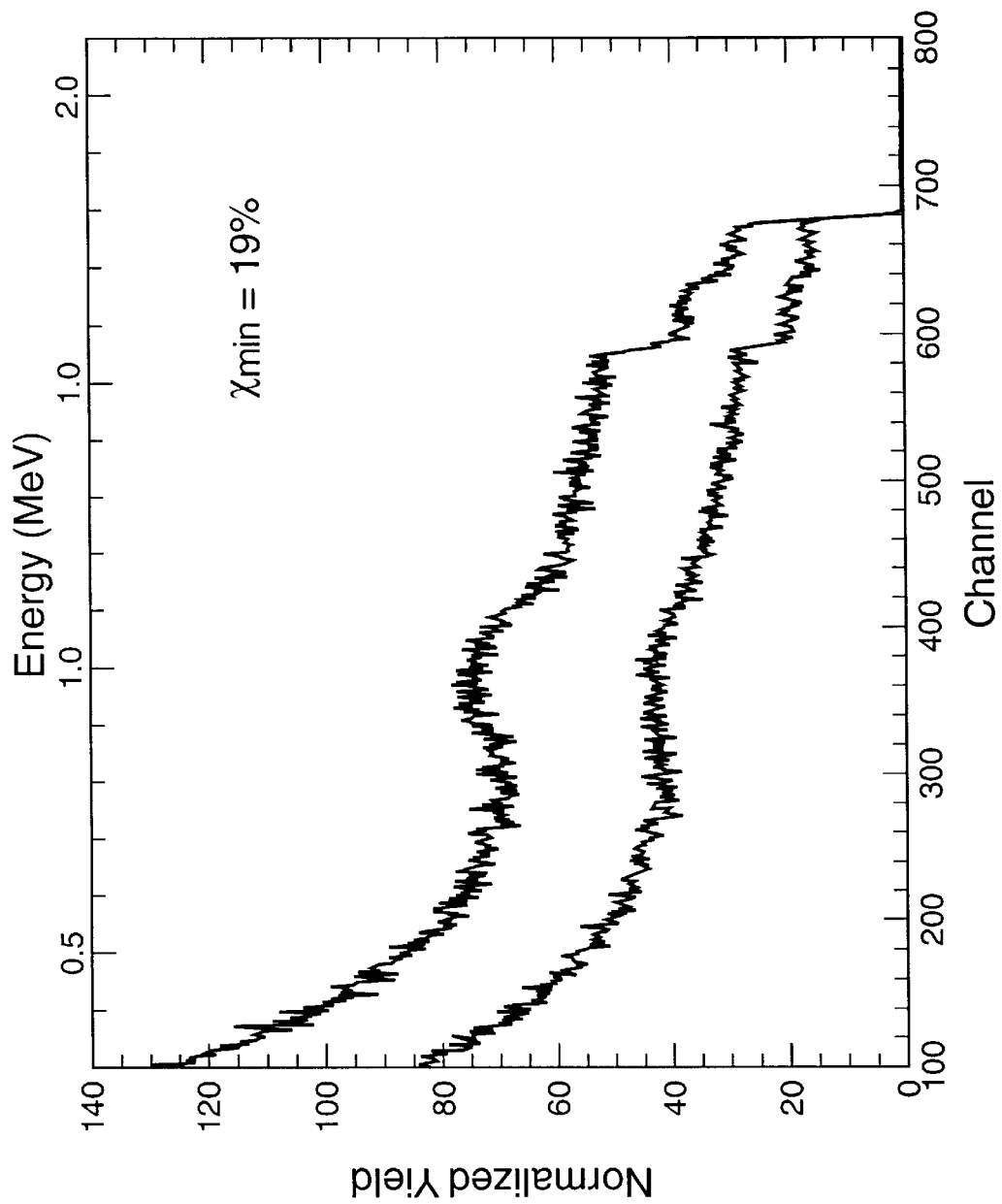
FIG. 4 shows the RBS spectra for a single layer YBCO on a $LaAlO_3$ substrate where the dashed and solid lines represent the channeling and random spectra respectively and the total thickness of the YBCO layer is 1.2 $\mu$m.

For comparison, a single layer YBCO of 1.2 μm in thickness was deposited on a similar LaAlO$_3$ substrate using pulsed laser deposition under the same processing conditions. As seen in FIG. 4, Rutherford backscattering spectroscopy on this single YBCO layer yielded a $\chi_{min}$ of about 55 percent.

From these results, it is concluded that the microstructure disordering in a YBCO film can be greatly reduced by using the multilayer structure as opposed to the single layer structure. In other words, more disorders or defects are introduced into a YBCO film as the film thickness increases for a single layer YBCO film.

EXAMPLE 2

Coated-conductor tapes were prepared using Inconel 625 as the base substrate. The tape was polished, and a biaxially-textured layer of yttria-stabilized zirconia (YSZ) was deposited using ion-beam-assisted-deposition (IBAD) with an ion-assist gun as described by U.S. Pat. No. 5,872,080, and Foltyn et al., IEEE Trans. Appl. Supercond., vol. 9, pp. 1519–1522, 1999, such descriptions hereby incorporated by reference. Additional layers of YBCO and $CeO_2$ of desired thickness were then deposited using pulsed-laser deposition (PLD).

Figure 6:
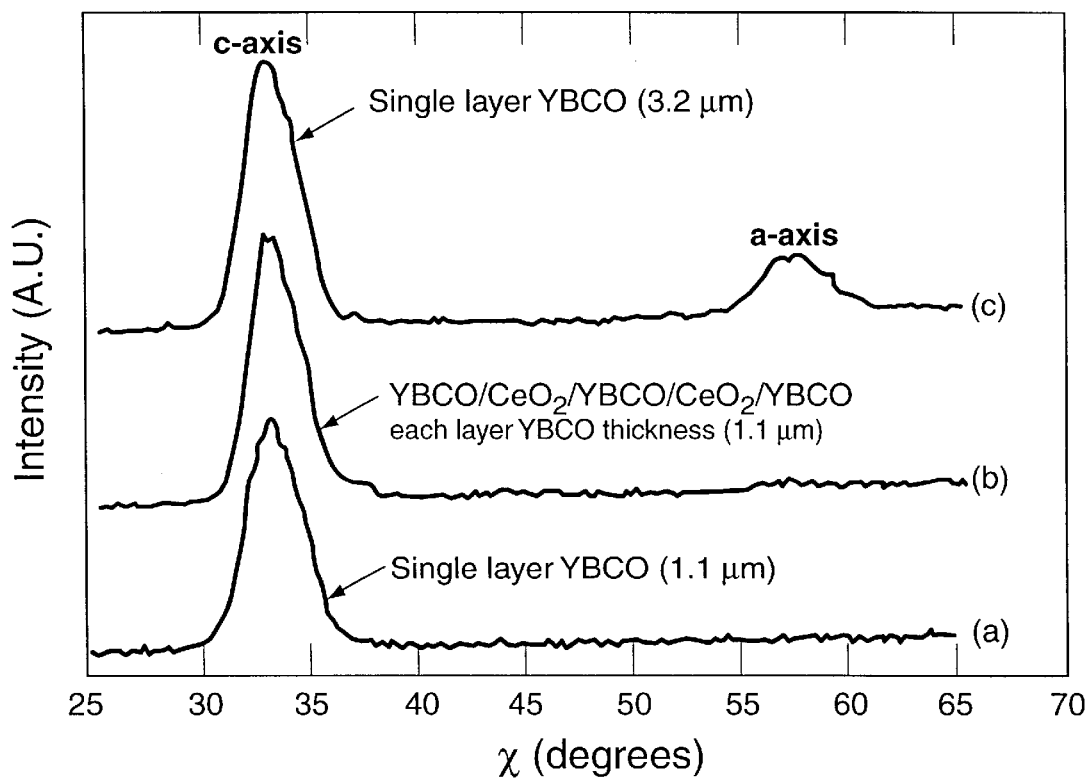
FIG. 6 shows X-ray diffraction $\chi$-scans on (102) YBCO peaks on metal substrates of (a) a single layer 1.1 $\mu$m thick YBCO, (b) a trilayer $YBCO/CeO_2/YBCO/CeO_2/YBCO$ with each YBCO layer 1.1 $\mu$m thick, and (c) a single layer 3.2 $\mu$m thick YBCO.
Figure 7:
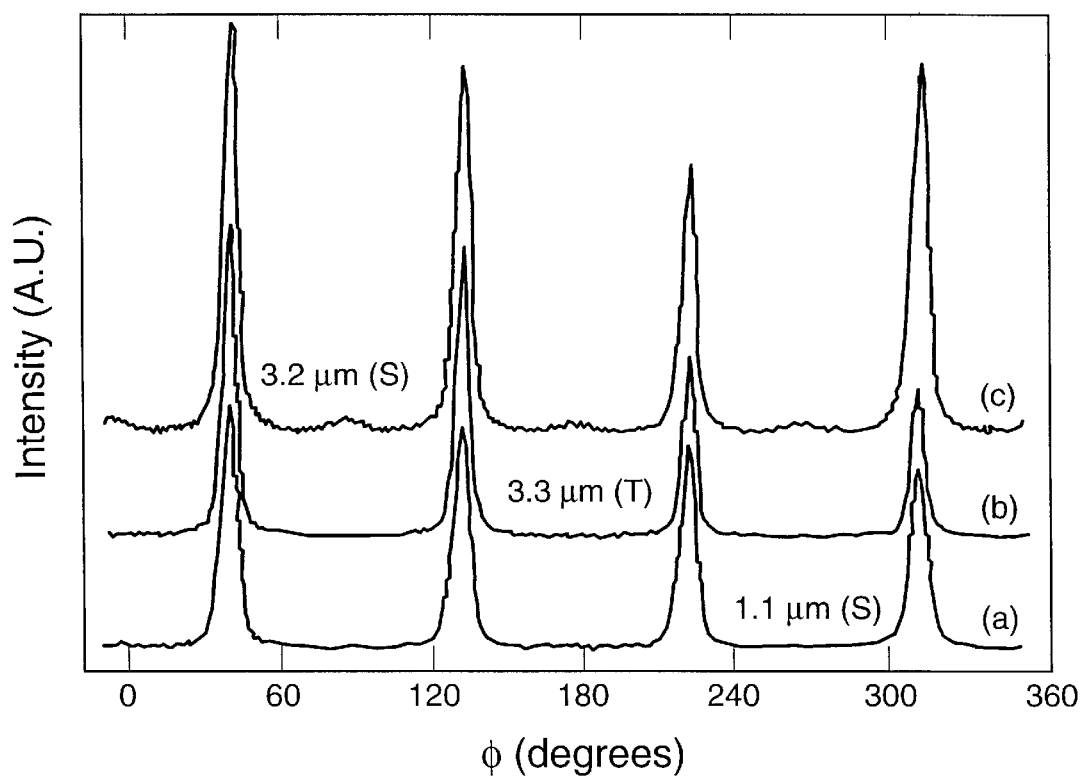
FIG. 7 shows X-ray diffraction $\phi$-scans on (103) YBCO peaks on metal substrates of (a) a single layer 1.1 $\mu$m thick YBCO, (b) a trilayer $YBCO/CeO_2/YBCO/CeO_2/YBCO$ with each YBCO layer 1.1 $\mu$m thick, and (c) a single layer 3.2 $\mu$m thick YBCO.

FIG. 6 shows X-ray diffraction $\chi$-scans on (102) YBCO peaks on metal substrates of (a) a single layer 1.1 $\mu$m thick YBCO, (b) a trilayer YBCO structure (YBCO/$CeO_2$/YBCO/$CeO_2$/YBCO) with each YBCO layer 1.1 $\mu$m thick, and (c) a single layer 3.2 $\mu$m thick YBCO. As expected, the single layer 1.1 $\mu$m thick YBCO on the metal substrate was purely c-axis oriented. As the YBCO film thickness increased to 3.2 $\mu$m, a-axis grains were detected as shown in FIG. 6 at $\chi$ angle 60 degrees though the percentage of the a-axis to c-axis was less than about 25 percent. These a-axis grains were invisible even for a 3.3 $\mu$m thick film by using the multilayer structure with three separate 1.1 $\mu$m layers of the YBCO. It should be noted that the use of the multilayer structure also eliminated 45° rotated grains as evident from x-ray diffraction phi scans on the YBCO (103) peak (see FIG. 7). Examination of scanning electron micrographs of both the trilayer YBCO structure with each YBCO layer 1.1 $\mu$m thick, and the single layer of 3.2 $\mu$m thick YBCO revealed very limited a-axis nucleation sites for the multilayer 3.3 $\mu$m thick YBCO film while many a-axis nucleation sites were observed on the surface of the single layer of 3.2 $\mu$m thick YBCO. While not wishing to be bound by the present explanation, it is believed that the growth of a-axis grains with increasing YBCO thickness is from the rough YBCO surface that occurs as the YBCO layer is getting thicker. By depositing YBCO on $SrTiO_3$ substrates with (a) well polished surfaces and (b) unpolished rough surfaces, it was found that rough surfaces promoted growth of a-axis grains.

EXAMPLE 3

Figure 8:
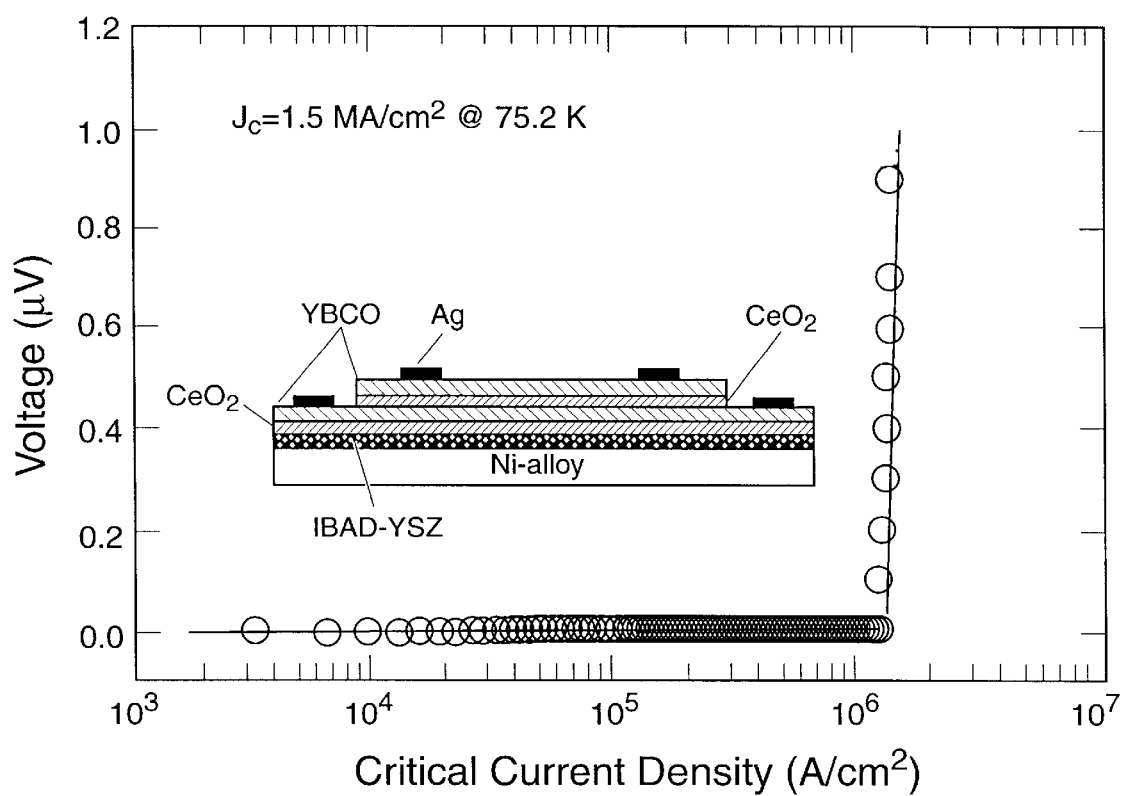
FIG. 8 shows critical current densities of top (open-circle) and bottom (solid-line) YBCO layers for a bilayer YBCO (1.1 $\mu$m)/$CeO_2$ (100 nm)/YBCO (1.1 $\mu$m) on an IBAD-YSZ-Ni alloy substrate measured at 75.2 K and zero field.
Figure 9:
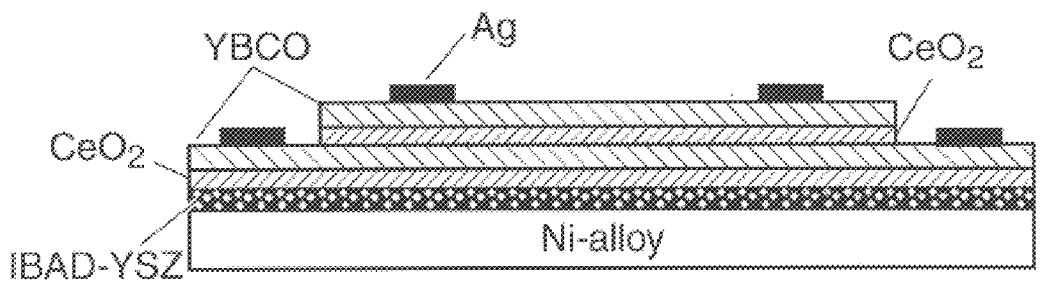
FIGS. 9(a)–(d) show a contact arrangement for measurement of critical current on a multilayer YBCO structure, where an insulating or conducting material is used as an interlayer.
Figure 9:
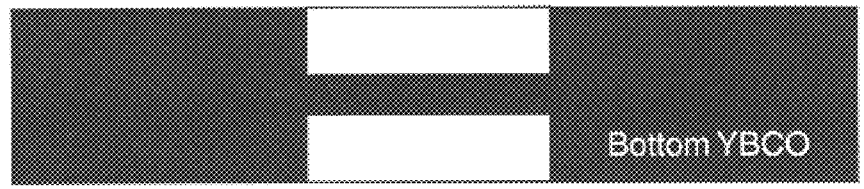
Figure 9:
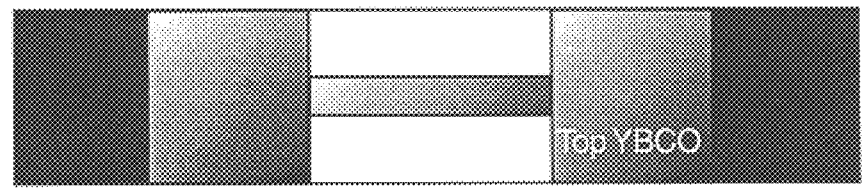
Figure 9:
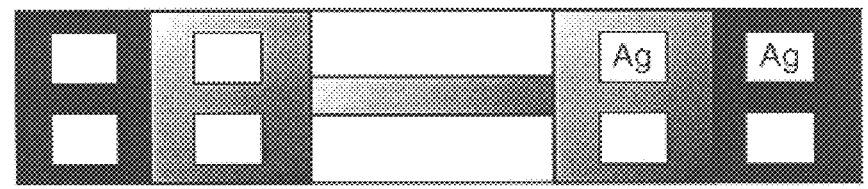
Figure 10:
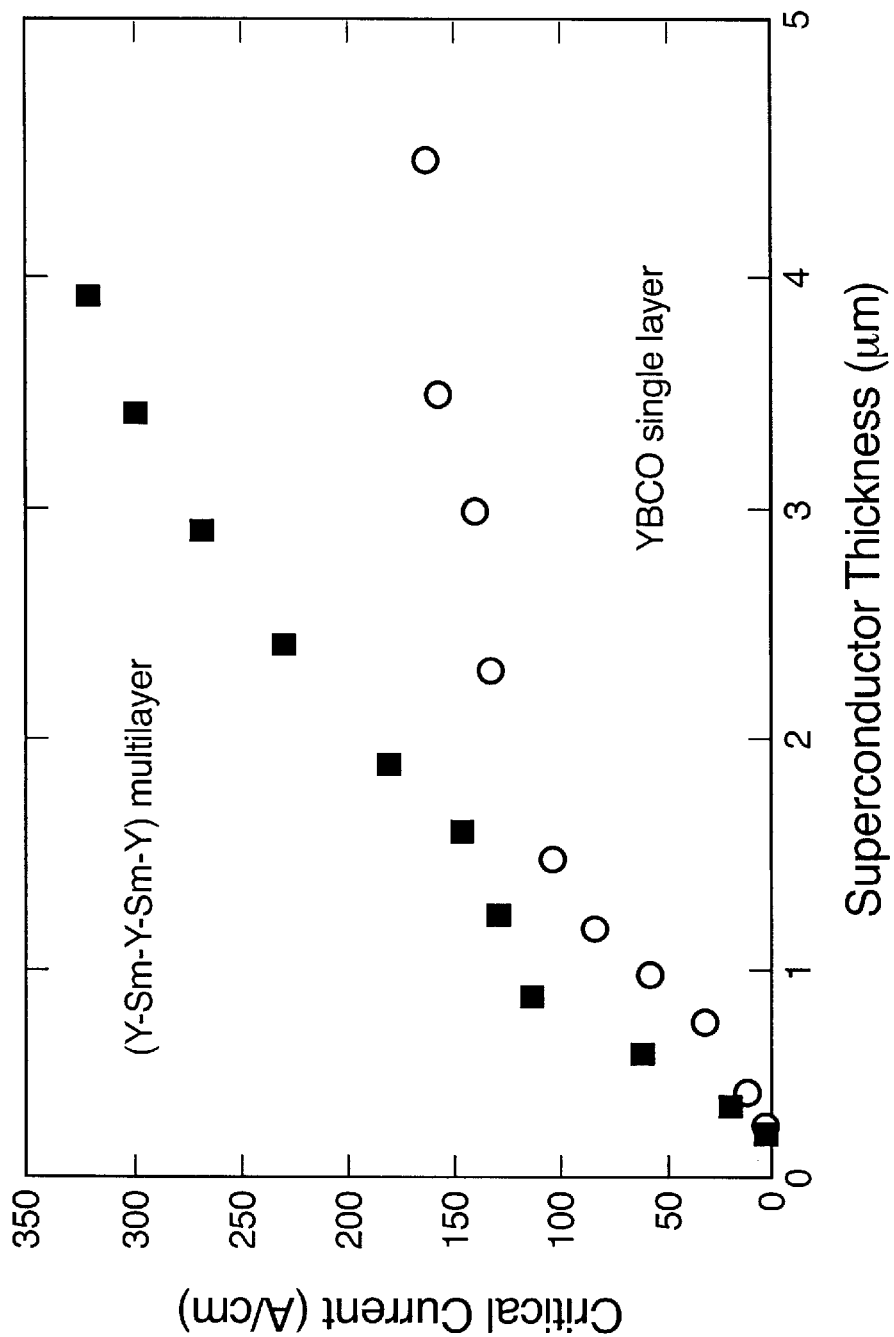
FIG. 10 shows the critical current for a single layer YBCO film and a multilayer Y—Sm—Y—Sm—Y film where the total film thickness was formed and the film was gradually thinned by ion milling prior to each successive critical current measurement.

In order to test the supercurrent of the multilayer YBCO films, an electrical contact system was designed so that the supercurrent from each individual layer of YBCO could be tested. This contact system was needed, as $CeO_2$ is an insulating material that can block the flow of supercurrent between the neighboring YBCO layers. First, a 1.1 $\mu$m thick YBCO layer was deposited on a $CeO_2$/IBAD-YSZ/Ni-alloy substrate. This YBCO layer was then patterned into a bridge. A shadow mask was used to locally cover this patterned YBCO layer. A second $CeO_2$/YBCO layer was then deposited upon the YBCO to form a bilayer structure of YBCO/$CeO_2$/YBCO. In this example, the $CeO_2$ was deliberately made thicker, i.e., a 100 nm $CeO_2$ interlayer that was thick enough to electrically isolate the top and bottom YBCO layers. The top YBCO layer having a thickness of 1.1 $\mu$m was further patterned into a bridge on the top of the bottom bridge. Silver electrodes were deposited on both top and bottom YBCO layers for critical current measurements. This contact scheme is shown in FIG. 9. By using this contact system and a thicker $CeO_2$ interlayer, the critical current was independently measured for the top and bottom YBCO layers. FIG. 8 shows the critical current densities of the top and bottom YBCO layers. Both top and bottom YBCO layers showed a similar critical current density of about 1.4–1.5 $MA/cm^2$ at 75.2 K and an $I_c$ of about 310 A/cm-width. In comparison, a single layer of YBCO having the same approximate film thickness of 2.2 $\mu$m on a polycrystalline Ni-alloy substrate had a critical current density of about 0.88 $MA/cm^2$ at 75.2 K and an $I_c$ of about 194 A/cm-width. Thus, a 60 percent increase in critical current and critical current density was achieved by using the multilayer YBCO structure. In a trilayer YBCO structure (YBCO/$CeO_2$/YBCO/$CeO_2$/YBCO) with each YBCO layer being 1.2 $\mu$m in thickness on a metal substrate, the top YBCO layer exhibited a supercurrent of 1.4 $MA/cm^2$ at 75.2 K. In that instance, the critical current densities from the middle and bottom YBCO layers were not tested due to the difficulty in forming the contact electrodes, but the lowest $J_c$ is usually for the "highest" or "top" layer in the stack, so the "middle" and "bottom" layers are expected to be no worse than the "top".

EXAMPLE 4

On an IBAD-YSZ-coated metal substrate, a five layer structure consisting of 1.1 $\mu$m YBCO/0.22 $\mu$m SmnBCO/1.1 $\mu$m YBCO/0.22 $\mu$m SmBCO/1.1 $\mu$m YBCO was formed. The total superconductor thickness was about 3.8 $\mu$m. For comparison of properties, a 3.6 $\mu$m single-layer YBCO film was also formed.

As is typical for both multilayers and mixtures involving other rare earth metals, the $T_c$ of the Y-Sm multilayer was higher, at 92 K, than is typical for pure YBCO (89 K for the 3.6 $\mu$m single-layer YBCO film). Most importantly, however, was that the $J_c$ for the multilayer was significantly higher than for the single layer control sample. The multilayer had a $J_c$ of 1.1 $MA/cm^2$ and an $I_c$ of 413 A/cm-width, while the single layer YBCO had a $J_c$ of 0.45 $MA/cm^2$ and an $I_c$ of 162 A/cm-width.

Although the present invention has been described with reference to specific details, it is not intended that such details should be regarded as limitations upon the scope of the invention, except as and to the extent that they are included in the accompanying claims.

What is claimed is:

1. A superconducting structure comprising:
    a metallic substrate; and,
    a film of a superconducting rare-earth-barium-copper oxide upon said substrate, said film comprising a composite multilayer structure of a first layer of a superconducting rare-earth-barium-copper oxide from about 0.2 microns to about 2 microns in thickness, a layer of an insulating material selected from the group consisting of cerium oxide, strontium titanate, yttrium oxide, magnesium oxide, and yttria-stabilized zirconia, or of a conducting material selected from the group consisting of lanthanum strontium cobalt oxide and strontium ruthenium oxide, and a second layer of a superconducting rare-earth-barium-copper oxide from about 0.2 microns to about 2 microns in thickness, said superconducting structure characterized as having a total combined thickness of superconducting rare-earth-barium-copper oxide layers of at least 2 microns and characterized as having a critical current for said composite multilayer structure greater than a critical current for a single superconducting rare-earth-barium-copper oxide layer of at least 2 microns in thickness, said single superconducting rare-earth-barium-copper oxide layer including the same rare-earth as the composite multilayer structure.

2. The structure of claim 1 wherein said insulating layer is from about 25 nm to about 100 in thickness.

3. The structure of claim 1 wherein said insulating layer is from about 40 nm to about 60 nm in thickness.

4. The structure of claim 1 including further alternating layers of: (a) an insulating material selected from the group consisting of cerium oxide, strontium titanate, yttrium oxide, magnesium oxide, and yttria-stabilized zirconia, or of a conducting material selected from the group consisting of lanthanum strontium cobalt oxide and strontium ruthenium oxide; and, (b) a superconducting rare-earth-barium-copper oxide from about 0.2 microns to about 2 microns in thickness.

5. The structure of claim 1 wherein said rare-earth-barium-copper oxide in said first superconducting layer and said second superconducting layer is yttrium-barium-copper oxide.

6. The structure of claim 1 wherein said rare-earth-barium-copper oxide in said first superconducting layer is yttrium-barium-copper oxide and the rare-earth-barium-copper oxide in said second superconducting layer is other than yttrium-barium-copper oxide.

7. The structure of claim 1 wherein said rare-earth-barium-copper oxide in at least one of said first superconducting layer and said second superconducting layer includes a mixture of at least a first rare-earth-barium-copper oxide and a second rare-earth-barium-copper oxide.

* * * * *